(12) United States Patent
Neerhof et al.

(10) Patent No.: US 7,041,989 B1
(45) Date of Patent: May 9, 2006

(54) LITHOGRAPHIC APPARATUS AND DEVICE MANUFACTURING METHOD

(75) Inventors: Hendrik Antony Johannes Neerhof, Eindhoven (NL); Johannes Hubertus Josephina Moors, Helmond (NL); Joost Jeroen Ottens, Veldhoven (NL); Marco Le Kluse, Maassluls (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/970,733

(22) Filed: Oct. 22, 2004

(51) Int. Cl.
G03B 27/58 (2006.01)
G03B 27/04 (2006.01)
G03B 27/62 (2006.01)
H01L 21/66 (2006.01)

(52) U.S. Cl. .............. 250/492.2; 250/504 R; 355/72; 355/73; 355/75; 269/20; 269/30; 269/32; 269/37; 269/44; 438/17

(58) Field of Classification Search ............... None
See application file for complete search history.

(56) References Cited

U.S. PATENT DOCUMENTS

| | | | |
|---|---|---|---|
| 6,178,221 B1 * | 1/2001 | Levinson et al. | 378/35 |
| 6,465,795 B1 * | 10/2002 | Madonado et al. | 250/492.2 |
| 6,498,350 B1 * | 12/2002 | Kwan et al. | 250/442.11 |
| 6,778,258 B1 * | 8/2004 | del Puerto et al. | 355/72 |
| 6,897,945 B1 | 5/2005 | Ottens et al. | |
| 6,927,842 B1 * | 8/2005 | del Puerto et al. | 355/77 |
| 2001/0004105 A1 * | 6/2001 | Kwan et al. | 250/492.2 |
| 2004/0191935 A1 | 9/2004 | Tinnemans | |
| 2004/0223127 A1 | 11/2004 | Neerhof | |
| 2004/0257554 A1 * | 12/2004 | del Puerto et al. | 355/72 |
| 2005/0030512 A1 | 2/2005 | Zaal et al. | |
| 2005/0030515 A1 | 2/2005 | Ottens et al. | |
| 2005/0128459 A1 | 6/2005 | Zwet et al. | |

* cited by examiner

Primary Examiner—Nikita Wells
Assistant Examiner—Bernard E. Souw
(74) Attorney, Agent, or Firm—Pillsbury Winthrop Shaw Pittman LLP

(57) ABSTRACT

A lithographic apparatus is disclosed. The apparatus includes an illumination system arranged to provide a radiation beam, an article support configured to support an article to be placed in a beam path of the radiation beam, a multipolar clamp configured to provide a clamping pressure for clamping the article against the article support, and a bias voltage circuit for biasing at least one electrode of the multipolar clamp, such that the occurrence of ridges that appear due to static charges on the article may be circumvented.

20 Claims, 6 Drawing Sheets

LITHOGRAPHIC APPARATUS AND DEVICE MANUFACTURING METHOD

FIELD

The present invention relates to a lithographic apparatus. The present invention also relates to a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern may be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In the lithographic apparatus as hereabove specified, an article to be placed in the radiation beam may be held to an article holder by a clamping electrode. Such electrostatic clamping may be used, for example, when a substrate is processed in vacuum conditions. This type of processing occurs, for example, when the type of irradiation used for photolithographic processes is in the (soft) x-ray region, also referred to as Extreme Ultraviolet (EUV) region. Electrostatic clamping makes use of an electric field between the article holder and the article. In this way, electrostatic forces may be used that are present between electrical charge differences in (local) areas of the article holder and the article in order to provide a clamping pressure. Such electrical charge differences occur when the electrode in the article holder is charged and, for example, the article is grounded. Otherwise, in the article holder, a plurality of electrodes of opposite voltages may be present, which introduce an opposite charge distribution in the article, preferably leaving no excess charge in the article. In a setting where such a multipolar clamp is used, there is a risk that the article may be unevenly clamped, which may result in deformation of the article, and a corresponding loss in image quality when used for photolithographic purposes. Ultimately, such uneven clamping may even result in handling problems during placement and removal of the article, which may cause loss of production time and may even cause loss of the article.

In the context of this application, the "article" may be e.g., a wafer, reticle, mask, or substrate.

SUMMARY

In one embodiment, the present invention provides a lithographic apparatus that is provided with a structure to prevent deformation of the article near the boundaries of the electrode, and that results in a better leveled article so that higher image quality may be attained.

According to another embodiment of the invention, there is provided a lithographic apparatus that comprises an illumination system arranged to provide a radiation beam, an article support configured to support an article to be placed in a beam path of the radiation beam, a multipolar clamp configured to provide a clamping pressure for clamping the article against the article support; and a bias voltage circuit for biasing at least one electrode of the multipolar clamp.

By providing a biasing circuit, the multipolar clamp may be biased so that accumulating charges on the article will not result in uneven attraction forces of the clamps. It has been found that due to photo-electric effect or other parasitic charging effects, the article, in particular, a substrate or a reflective reticle, may be charged to about 90 Volts. The article may be grounded to avoid the occurrence of such static charges. However, this may be problematic due to the semiconductor properties of the article so that a grounding contact may vary between zero and infinite Ohms. Hence, a standard application of clamping voltages of for example ±3000V may lead to a voltage difference of 2910V between the + electrode and the article, and 3090V between the − electrode and the article. In the bordering area between the + and − electrodes of the multipolar electrode, a voltage difference of two times the static charge induced voltage of the article may appear. This voltage difference may manifest itself, due to the differing attractive forces exerted on the article, as a physical step in the generally flat wafer surface, which may result in unacceptable focus and overlay errors.

According to another embodiment of the invention, there is provided a lithographic apparatus that includes an illumination system arranged to provide a radiation beam, an article support configured to support an article to be placed in a beam path of the radiation beam, a multipolar clamp configured to provide a clamping pressure for clamping the article against the article support, and a fluid dispensing structure for dispensing an electro-conductive fluid for neutralizing static charges on the article.

By providing a detector to detect an electric charge status of the article to be clamped, the handling of the article may be carried out accordingly. For example, if it appears that an article is charged, this may result in adjusting the handling routine of the article during placement and removal from the article support or adjusting the bias voltage.

In another embodiment of the invention, there is provided a lithographic apparatus that includes an illumination system arranged to provide a radiation beam, an article support configured to support an article to be placed in a beam path of the radiation beam, a multipolar clamp configured to provide a clamping pressure for clamping the article against the article support, and a fluid dispenser for dispensing an electro-conductive fluid for neutralizing static charges on the article.

A lithographic apparatus that includes a dispenser for dispensing a charged particles for neutralizing static charges on the article may provide an efficient and reliable way to prevent or treat the occurrence of static charging on an article to be irradiated.

According to another embodiment of the invention, there is provided an article support configured to support an article. The article support is provided with a multipolar clamp configured to provide a clamping pressure for clamping the article against the article support, and a bias voltage circuit for biasing at least one electrode of the multipolar clamp.

According to another embodiment of the invention, there is provided a device manufacturing method. The method includes transferring a pattern by a radiation beam, clamping an article to be placed in a beam path of the radiation beam with a multipolar clamp, moving the article into the beam path, and biasing at least one electrode of the multipolar clamp while the article is being irradiated.

In an embodiment, the device manufacturing method includes transferring a pattern by a radiation beam, clamping an article to be placed in a beam path of the radiation beam with a multipolar clamp, moving the article into the beam path, and detecting an electric charge status of the article to be clamped prior to removing the article from the beam path.

In an embodiment, the device manufacturing method includes transferring a pattern by a radiation beam, clamping an article to be placed in a beam path of the radiation beam with a multipolar clamp, moving the article into the beam path, and dispensing an electro-conductive fluid for neutralizing static charges on the article prior to removing the article from the beam path.

In such device manufacturing methods, the invention provides an adequate response to the prevention and occurrence of electric charging to the article due to the charging effects.

According to another embodiment of the invention, there is provided a multi stage lithographic apparatus for transferring a pattern from a patterning device onto a substrate and for carrying out parallel, or preparatory transferring steps on multiple stages. The apparatus includes an illumination system arranged to provide a radiation beam, and a plurality of stages. Each stage includes a support configured to support an article to be placed in a beam path of the radiation beam. The support includes a multipolar clamp configured to provide a clamping pressure for clamping the article against the support, and a bias voltage circuit for biasing at least one electrode of the multipolar clamp. The article is one of the patterning device and the substrate. Each stage also includes a stage status detection circuit for detecting a status of the stage, and a bias voltage control circuit for controlling the bias voltage circuit based on the status of the stage detected by the stage status detection circuit.

In a multistage context, where alignment and illumination may be carried out on multiple stages, the occurrence of static charging may be especially destructive for image resolution. When the alignment occurs in a non-irradiated situation in which static charging of the article is diminished, and transferring of the pattern by projection is carried out thereafter, the alignment may be obstructed and image projection may be misaligned, due to static charging.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
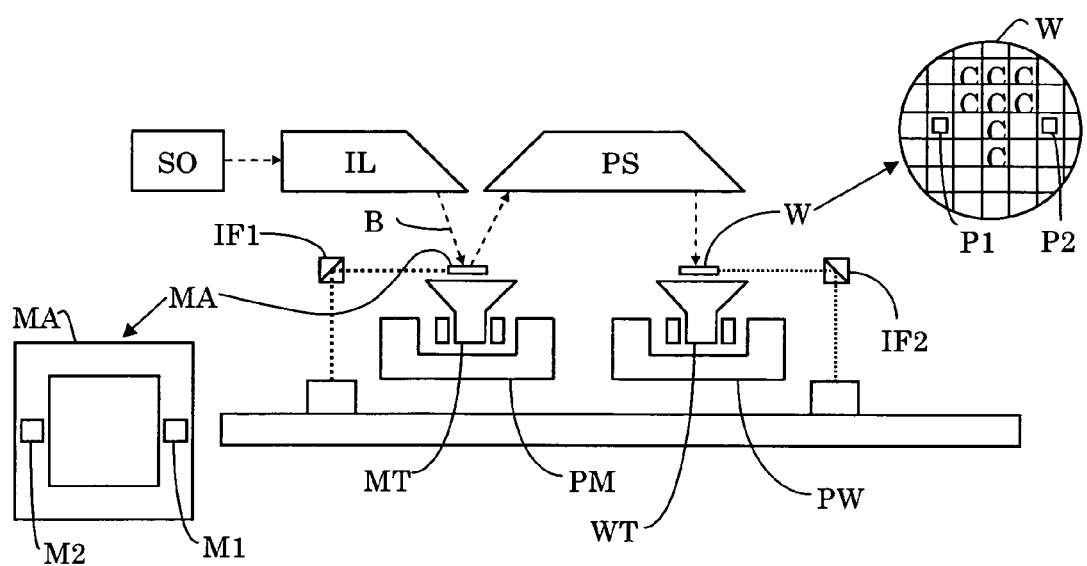
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as, for example, whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
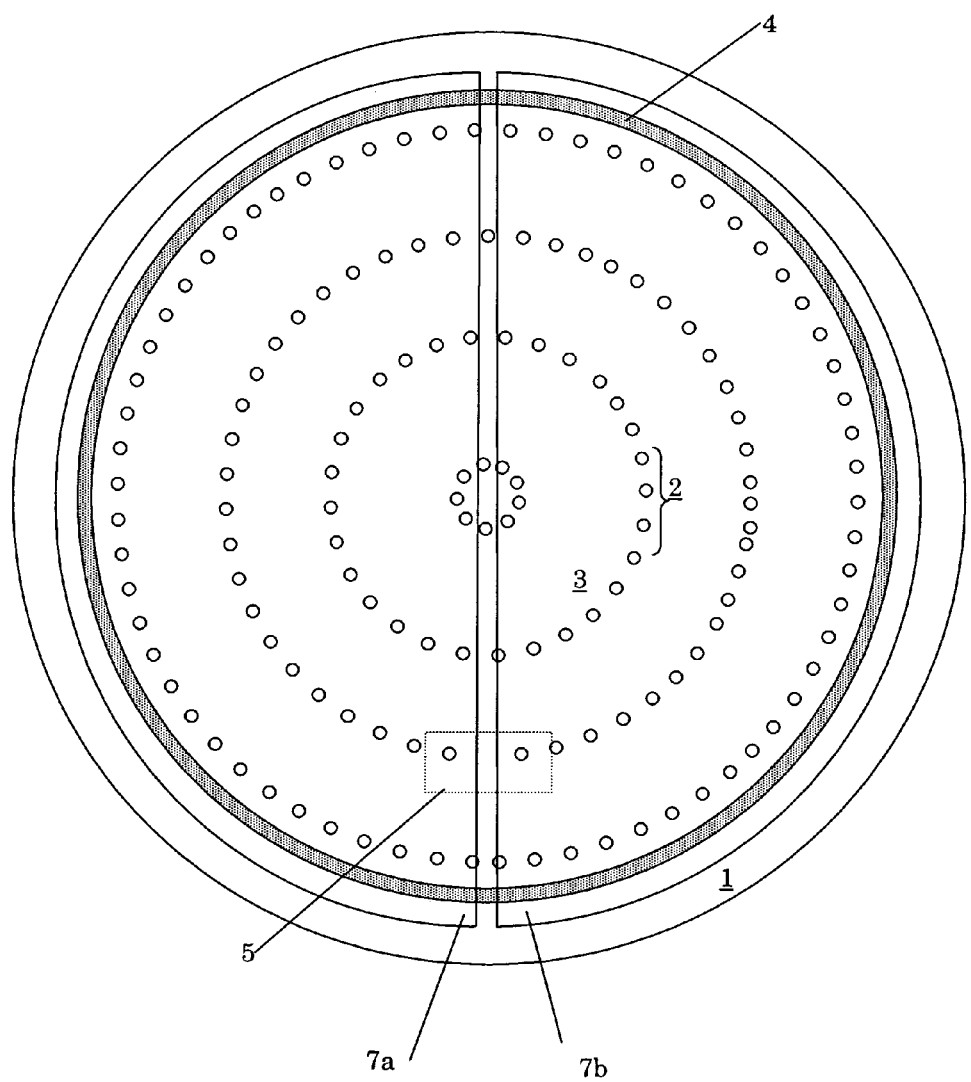
FIG. 2 depicts an article support of the apparatus of FIG. 1, according to the invention.

FIG. 2 depicts an article support 1 of the lithographic apparatus of FIG. 1. In this embodiment, the article support 1 is configured to support a wafer, shortly to be called wafer support table or wafer table, as explained with reference to FIG. 1, and generally circular in form, which is common for wafer support tables. However, the article support may also be of another shape, in particular, a square shape, which may be used in the context of a mask table (see FIG. 1) or a so-called fiducial clamp, which is used for alignment purposes. The wafer support table 1 includes a plurality of protrusions 2 that are dimensioned to provide a flat support for supporting a wafer (not shown). For clarity's sake, only a few protrusions 2 are referenced. The protrusions 2 thereby define a support zone 3. The boundary of the support zone 3 may be formed by a surrounding wall 4, which may form a seal for confining or restricting outflow of backfill gas (not shown) that is generally used for cooling purposes. A sectional view of dotted area 5 is further illustrated with reference to FIG. 3. In the illustrated embodiment, the wafer table 1 includes two clamping electrodes 7a and 7b, which are charged with generally opposite charges. Due to a capacitive clamping effect, the wafer is pressed against the wafer table 1. Because the polarity of the electrodes 7a, 7b is generally opposite, the potential of wafer 6 is kept neutral (see FIG. 2).

Figure 3:
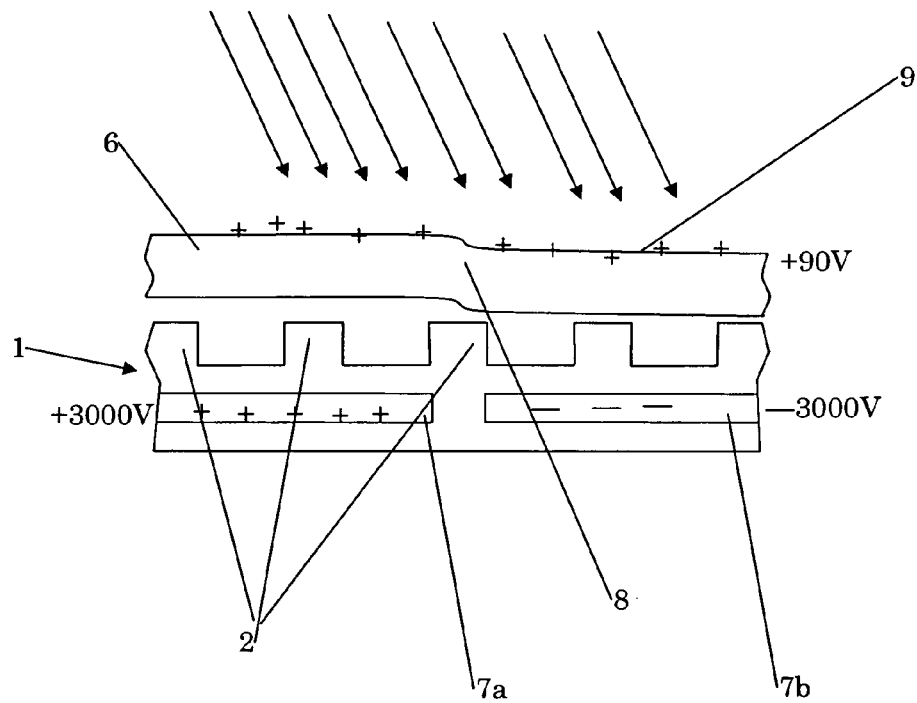
FIG. 3 show a schematic side view of the article support of FIG. 2.

FIG. 3 shows a cross sectional view of the dotted area 5 displayed in FIG. 2. As can be seen in FIG. 3, due to the irradiation of the wafer, a photo-electric effect occurs, which may be described as losing electrons, which results in static charging of the wafer 6. Hence, in a situation where a conventional clamping is used, for example, a clamp operative at 3000V, the plus and minus electrodes are oppositely charged. Due to the static charging of the wafer, however, there occurs an uneven voltage difference near the boundaries of the electrodes 7a, 7b. In particular, the wafer is charged +90V and the electrodes are charged with +3000 V for the positive electrode 7a, and −3000 V for the negative electrode 7b. This results in an uneven potential difference of 3090 V on the negative electrode and 2910 V for the positive electrode 7a. Thus, an uneven clamping force exerted by the clamping electrodes 7a, 7b, may cause the wafer 6 to elastically deform near the boundary of the electrodes 7a, 7b in an area identified by 8. This voltage difference may manifest itself, due to the differing attractive forces exerted on the wafer 6, as a physical step in the generally flat wafer surface 9, which may result in unacceptable focus and overlay errors.

Figure 4:
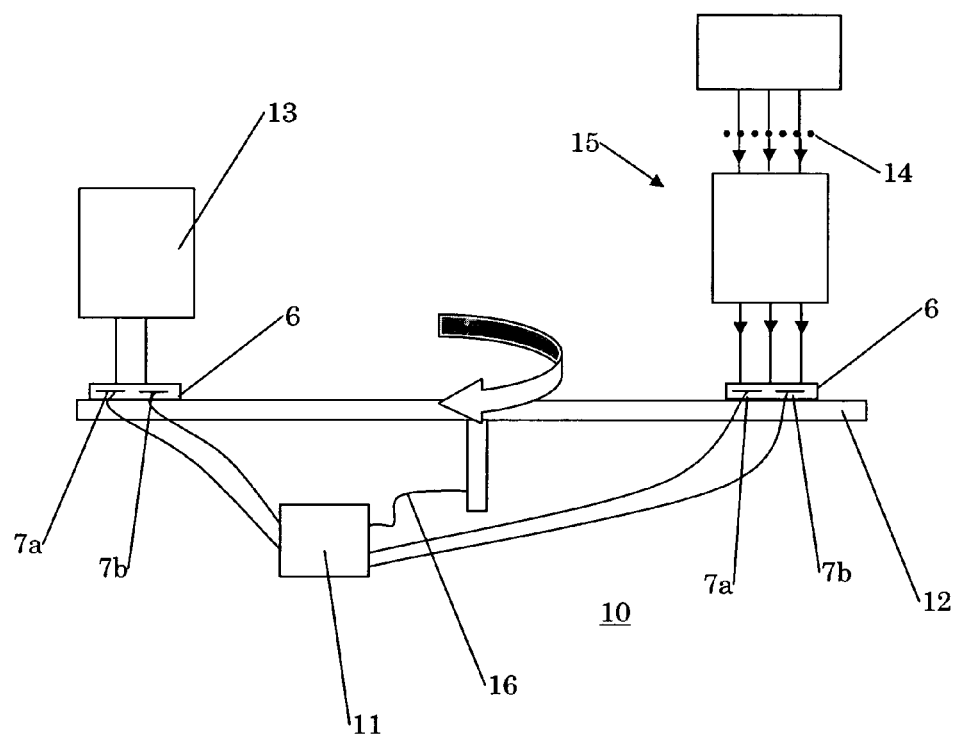
FIG. 4 shows another embodiment of the invention in a multi stage projection apparatus.

FIG. 4 shows an embodiment of the invention for a multistage photolithographic apparatus 10 having a control circuit 11. The control circuit 11 is electrically connected clamping electrodes 7a, 7b of multiple wafer support tables 12. This embodiment is a so-called two stage apparatus or twin-scan apparatus, in which the alignment and further preparatory tasks for carrying out a photolithographic transfer process are executed in two different contexts: an alignment context 13 in which the wafer to be provided with a transferred image of a reticle 14 is aligned and a height map is provided to be able to control photo-illumination context 15 (in particular: the projection apparatus and/or the movement of wafer 6 actuated by positioners PM and PW, as explained with reference to FIG. 1). Further particulars of such twin scan setup may be found in U.S. Pat. No. 5,969,441 and WO-98/40791, which are incorporated herein by reference. Due to the multiple stage contexts 13 and 15 alternating, the wafer is illuminated during photolithographic transferring processes, and scanned (using considerably less radiation incidence of a nature possibly different from the radiation used for transferring purposes), which may result in static charging and decharging of wafer 6. That is, in the photo-illumination context 15 in which the wafer is subjected to a pattern transferring process, due to photoelectric charging, the wafer is charged to a potential of roughly +90 V; and in the alignment context 13, the wafer decharges due to grounding and parasitic decharging, which may result in a potential of roughly zero Volts. The control circuit 11 has a signal line 16 coupled to the multistage apparatus 10 to detect whether the wafer is illuminated or not. In the embodiment shown, this signal line 16 is coupled to detect the physical location of the wafer 6. Other detection mechanisms may be used (see FIG. 5 for a detection using a charge map), or a photo detector for detecting irradiation of radiation on the wafer 6 may be used.

Depending on a status signal in the signal line 16, the control circuit 11 controls the electric voltages supplied to electrodes 7a, 7b. That is, in the situation where the signal line 16 indicates that the wafer is irradiated in the photo-illumination context 15, a biasing voltage is provided to the electrodes 7a and 7b, for example, the plus electrode 7a is provided with a +3000 Volts (unbiased) and the minus electrode 7b is provided with a −2820 Volts (biased). As will be apparent, in this example, the biasing voltage is twice the measured or expected static charge of the wafer. It will be apparent that other combination are equally valid, for example, where both electrodes 7a and 7b are biased in order to define a predetermined voltage difference between the electrodes 7a and 7b and the wafer 6.

Figure 5:
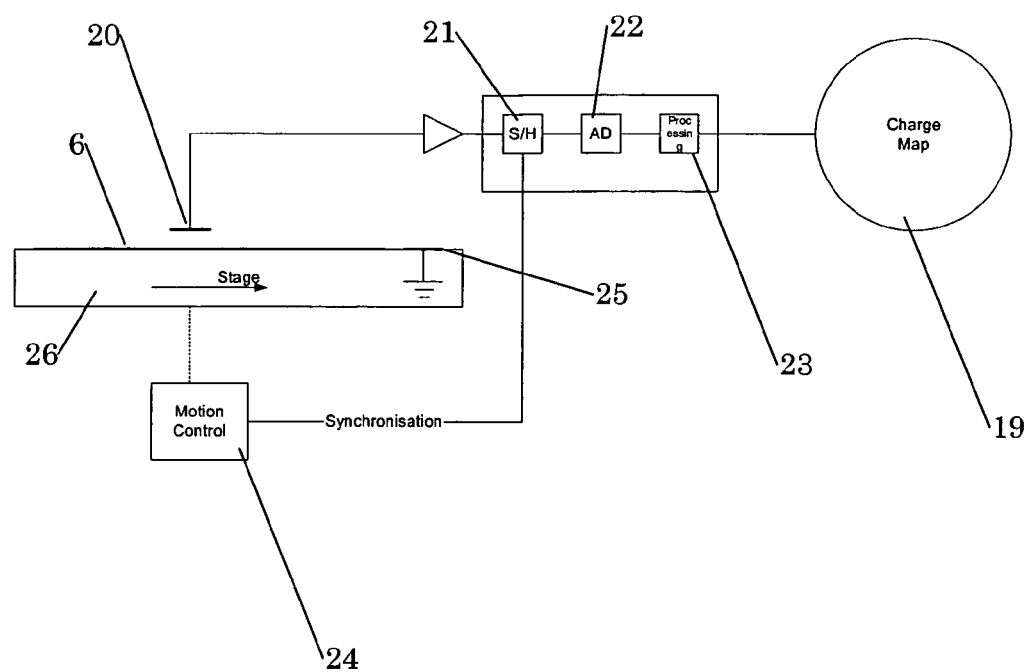
FIG. 5 shows a schematic of a charge mapping arrangement that may be used in the apparatus of FIG. 1.

FIG. 5 shows a embodiment that can be used separately from the previous embodiments, for example, for detecting (local) static charges prior to handling a wafer 6 with a handling mechanism 17, as explained with reference to FIG. 6. Thus, the FIG. 5 embodiment represents a charge mapping arrangement 18 that is used to provide a charge map 19 that indicates the presence of static charges on the wafer, which can be used as a diagnosis tool for diagnosing possible malfunctioning of electrostatic clamping, or other problems, for example, handling problems of the wafer 6 during placement or removal of the wafer 6 on the wafer support table. The charge mapping arrangement includes a probe 20 that is connected via a sample/hold circuit 21 and an A/D converting circuit 22 to a processor 23, which is also fed by output of a motion control circuit 24 for detecting the position of the probe 20 relative to the wafer 6. Via the well known equations, $$C = Q/V \quad [1]$$

and $$C = (\epsilon_0 \epsilon_r A)/d \quad [2]$$

where C is electrostatic capacity [F],
Q is electrostatic charge [As,]
V is electrostatic potential [V],
$\epsilon_0$ is dielectric permittivity 8.9e−12 [F/m],
$\epsilon_r$ is relative dielectric permittivity for vacuum=1 [ ],
A is probe area [m^2], and
d is distance between probe and wafer [m],
the potential difference between probe 19 and wafer 6 (or any other article, including the wafer support itself or mask, reticle or fiducial to be scanned for the occurrence of static charge) may be calculated as well as the charge distribution in the wafer 6. To zero the probe 19, a grounded surface 25 may be used, for example, a TIS plate that is used for alignment purposes on the wafer stage 26. In zeroing the probe 20, all charge may be moved from the probe 20, and the voltage may be set to zero.

Figure 6:
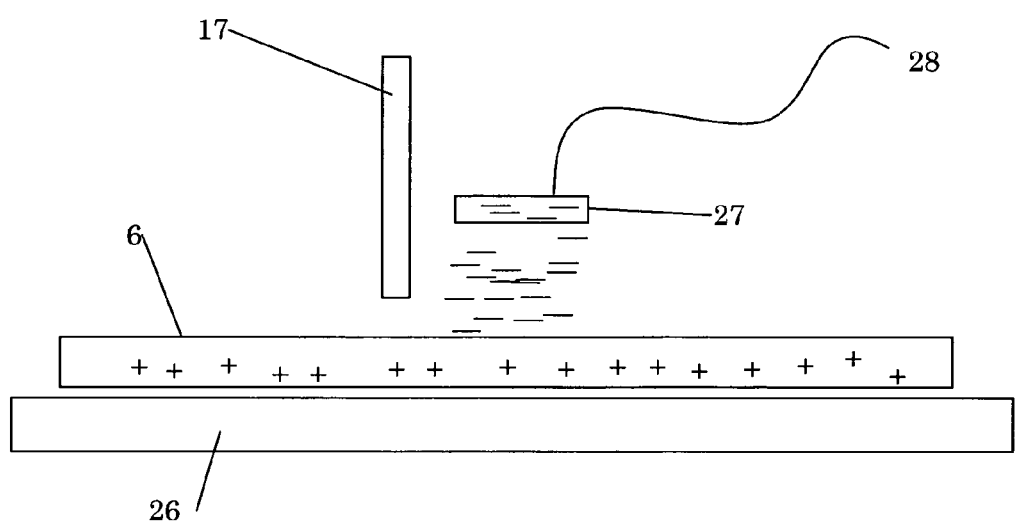
FIG. 6 shows the article support of FIG. 2 according to another embodiment of the invention.

FIG. 6 shows a further embodiment to be used in conjunction with the invention. Displayed is an a dispensing structure 27 for dispensing charged particles for neutralizing static charges on the article. In this context, the particles may be any non-contact media, such as ionized gas, plasma or simply electrons that are emitted by an electron emitting device 28. The purpose of this operation is a non-contact operation to neutralize the occurrence of static charges on the wafer 6 or any other article to be neutralized. For example, prior to handling the wafer 6, the positions relevant for providing clamping (specifically, electrostatic clamping) of a handling mechanism 17 that is used for placement of the wafer 6. Although not illustrated, the electron emitting device 28 may be coupled to the electric charge status detector displayed in FIG. 5 so that, relative to a measured static charge distribution, neutralizing action may be undertaken by the electron emitting device 28.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system arranged to provide a radiation beam;
    an article support configured to support an article to be placed in a beam path of said radiation beam;
    a multipolar clamp configured to provide a clamping pressure for clamping said article against said article support; and
    a bias voltage circuit for biasing at least one electrode of said multipolar clamp.

2. A lithographic apparatus according to claim 1, wherein said bias voltage circuit is configured act in response to said article being illuminated for biasing photoelectric effect static charges.

3. A lithographic apparatus according to claim 1, wherein the bias voltage circuit is coupled to a status detection circuit and is configured to act in response thereto.

4. A lithographic apparatus according to claim 3, wherein the status detection circuit comprises a detector to detect an electric charge status of the article to be clamped and the illumination system is arranged to provide an extreme ultraviolet radiation beam.

5. A lithographic apparatus according to claim 3, wherein the status detection circuit comprises a detector to detect an illumination status of the article.

6. A lithographic apparatus according to claim 1, further comprising a dispenser for dispensing charged particles to said wafer for neutralizing static charges on the article.

7. A lithographic apparatus according to claim 6, wherein said dispenser comprises an electron emitting device.

8. A lithographic apparatus according to claim 6, wherein said dispenser is configured to act in response to an electric charge status detector.

9. A lithographic apparatus according to claim 8, wherein said electric charge status detector comprises an capacitive electrode.

10. A lithographic apparatus according to claim 9 wherein said electric charge status detector is configured to provide a charge map of the article.

11. A lithographic apparatus comprising:
    an illumination system arranged to provide a radiation beam;
    an article support configured to support an article to be placed in a beam path of said radiation beam;
    a clamp configured to provide a clamping pressure for clamping said article against said article support; and
    a detector to detect an electric charge status of the article to be clamped.

12. A lithographic apparatus comprising:
    an illumination system arranged to provide a radiation beam;
    an article support configured to support an article to be placed in a beam path of said radiation beam;
    a multipolar clamp configured to provide a clamping pressure for clamping said article against said article support; and
    a fluid dispenser for dispensing an electro-conductive fluid for neutralizing static charges on the article.

13. A lithographic apparatus according to claim 12, wherein said fluid dispenser comprises an electron emitting device.

14. A lithographic apparatus according to claim 1, wherein said article support is a support configured to support a patterning device, the patterning device serving to impart the radiation beam with a pattern in its cross-section.

15. A lithographic apparatus according claim 1, wherein said article support is a substrate table configured to support a substrate to be patterned by a patterned beam of radiation onto a target portion of the substrate.

16. An article support configured to support an article in a lithographic apparatus, said article support being provided with:
  a multipolar clamp configured to provide a clamping pressure for clamping said article against said article support; and
  a bias voltage circuit for biasing at least one electrode of said multipolar clamp.

17. A device manufacturing method comprising:
  transferring a pattern by a radiation beam;
  clamping an article to be placed in a beam path of said radiation beam with a multipolar clamp;
  moving the article into the beam path; and
  biasing at least one electrode of said multipolar clamp while said article is being irradiated.

18. A device manufacturing method comprising:
  transferring a pattern by a radiation beam;
  clamping article to be placed in a beam path of said radiation beam with a multipolar clamp;
  moving the article into the beam path; and
  detecting an electric charge status of the article to be clamped prior to removing said article from the beam path.

19. A device manufacturing method comprising:
  transferring a pattern by a radiation beam;
  clamping an article to be placed in a beam path of said radiation beam with a multipolar clamp;
  moving the article into the beam path; and
  dispensing an electro-conductive fluid for neutralizing static charges on the article prior to removing said article from the beam path.

20. A multi stage lithographic apparatus for transferring a pattern from a patterning device onto a substrate and for carrying out parallel, or preparatory transferring steps on multiple stages, the apparatus comprising:
  an illumination system arranged to provide a radiation beam;
  a plurality of stages, each stage comprising:
    (i) a support configured to support an article to be placed in a beam path of said radiation beam, said support comprising a multipolar clamp configured to provide a clamping pressure for clamping said article against said support; and a bias voltage circuit for biasing at least one electrode of said multipolar clamp, wherein the article is one of the patterning device and the substrate;
    (ii) a stage status detection circuit for detecting a status of the stage; and
    (iii) a bias voltage control circuit for controlling said bias voltage circuit based on the status of the stage detected by said stage status detection circuit.

* * * * *